(12) United States Patent
Liang

(10) Patent No.: US 9,804,489 B2
(45) Date of Patent: Oct. 31, 2017

(54) METHOD FOR MANUFACTURING QUANTUM DOT COLOR FILTER

(71) Applicant: Shenzhen China Star Optoelectronics Technology Co., Ltd., Shenzhen (CN)

(72) Inventor: Yuheng Liang, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 194 days.

(21) Appl. No.: 14/902,583

(22) PCT Filed: Dec. 22, 2015

(86) PCT No.: PCT/CN2015/098155
§ 371 (c)(1),
(2) Date: Jan. 3, 2016

(87) PCT Pub. No.: WO2017/059629
PCT Pub. Date: Apr. 13, 2017

(65) Prior Publication Data
US 2017/0235223 A1     Aug. 17, 2017

(30) Foreign Application Priority Data
Oct. 8, 2015   (CN) .......................... 2015 1 0646777

(51) Int. Cl.
*G02B 5/20*     (2006.01)
*G02F 1/1335*   (2006.01)
*G03F 7/00*     (2006.01)

(52) U.S. Cl.
CPC ...... *G03F 7/0007* (2013.01); *G02F 1/133514* (2013.01); *G02B 5/201* (2013.01);
(Continued)

(58) Field of Classification Search
CPC ............. G03F 7/0007; G03F 1/133514; G03F 1/133516; G02B 5/201; G02B 5/206; G02B 5/223
(Continued)

(56) References Cited

U.S. PATENT DOCUMENTS

| 2013/0242228 A1* | 9/2013 | Park ................. G02F 1/133617 349/61 |
| 2016/0091640 A1* | 3/2016 | Wu ........................ G02B 5/201 359/891 |
| 2017/0176863 A1* | 6/2017 | Zhang ...................... G03F 7/40 |

* cited by examiner

*Primary Examiner* — John A McPherson
(74) *Attorney, Agent, or Firm* — Leong C. Lei

(57) ABSTRACT

The present invention provides a method for manufacturing a quantum dot color filter. The method for manufacturing a quantum dot color filter of the present invention, after forming a blue sub-pixel part of a quantum dot color filter by applying a photolithographic operation to a transparent organic photoresist material, applies hydrophobicity treatment to the transparent organic photoresist layer so as to make use of hydrophobic characteristics so formed to help coat green quantum dot curable paste and red quantum dot photoresist sequentially on corresponding areas to form, in sequence, a green quantum dot curable paste layer and a red quantum dot photoresist layer located thereon, and then applies photolithographic operations to subject portions of the red quantum dot photoresist layer to etching for forming a green sub-pixel part and a red sub-pixel part of the quantum dot color filter, whereby compared to the conventional ways of manufacturing a quantum dot color filter, at least one round of photolithographic operation can be saved to greatly simplify the manufacturing process, reduce cost, and improve manufacturing efficiency, and it only needs to develop one type of quantum dot photoresist so as to greatly reduce difficulty and cost of development.

15 Claims, 4 Drawing Sheets

(52) U.S. Cl.
CPC ........ *G02B 5/207* (2013.01); *G02F 1/133516* (2013.01); *G02F 2202/36* (2013.01)

(58) Field of Classification Search
USPC .......................................................... 430/7
See application file for complete search history.

METHOD FOR MANUFACTURING QUANTUM DOT COLOR FILTER

BACKGROUND OF THE INVENTION

1. Field of the Invention

The present invention relates to the field of display technology, and in particular to a method for manufacturing a quantum dot color filter.

2. The Related Arts

With the continuous development of the display technology, people increasingly demand higher and higher quality of displaying. Quantum dots (QDs) are nanometer semiconductor particles in the form of spheres or similar to spheres made of elements of II-VI groups or III-V groups, having a particle size between several nanometers and tens of nanometers. Since the particle size of QDs is less than or close to the exciton Bohr radius of the corresponding material, an quantum confinement effect is generally involved, where the energy band structure is changed from quasi-continuity of the body material to the discrete structure of the quantum dot material, making the quantum dots exhibiting unique behavior of stimulated emission of light. When the size of the QDs is decreased, the energy band gap becomes increased so that the energy required for exciting the QDs and the energy released from the excited QDs returning back to the ground state are increased correspondingly, exhibiting a "blue-shifting" phenomenon of the excitation of the QDs and the fluorescent spectrum. By controlling the size of the QDs, the emission spectrum thereof may be made covering the entire range of visible light. For example, when the size of cadmium selenide is decreased from 6.6 nm to 2.0 nm, the luminescence wavelength "blue-shifts" from red light zone of 635 nm to blue light zone of 460 nm.

Quantum dot materials have advantages, such as concentrated luminescence spectrum, high color purity, and luminescence color being easily adjustable through the size, structure, or composition of the quantum dot materials. Such advantages allow for applications in display devices to effectively improve the color gamut and color restorability of the display devices. For example, patent documents including CN 102944943 A and US 2015/0002788 A1 propose technical solutions of using quantum dot layers having a pattern structure to replace color filters for color displaying. However, such patent documents do not disclose the ways of patterning the quantum dot layers In making a quantum dot pattern of a conventional quantum dot display device, it is common to mix red, green, blue quantum dot materials respectively with red, green, and blue quantum photoresists, followed by exposure and development to form a patter including quantum dots. However, such a process requires the red, green, and blue quantum dots to be mixed with red, green, and blue quantum dot photoresists first and also requires three photolithographic operations, making the process complicated, and it also need to develop red and green quantum dot photoresists at the same time, making the development of quantum dot photoresists difficult. Besides the above method, quantum dot patterns may also be formed by means of transfer-printing and screen printing. However, the quantum dot patterns formed with transfer-printing have poor resolution, where edges of the patterns are in a serrated form and the adhering power between the quantum dot layer and the base requires being further improved. Inkjet printing may also be used to form patterned quantum dot layer and such a method has a severe requirement for the inkjet printing device. In addition, there is still technical barrier to maintain stability of the drops of ink jet and the precision of printing, making it not possible for use in mass production.

SUMMARY OF THE INVENTION

An object of the present invention is to provide a method for manufacturing a quantum dot color filter, which saves one round of photolithographic operation, simplifying the process, reducing cost, improving manufacturing efficiency, and lowering the difficult and cost for development of quantum dot photoresists.

To achieve the above object, the present invention provides a method for manufacturing a quantum dot color filter, which comprises the following steps:

(1) providing a substrate, the substrate comprising a plurality of blue sub-pixel zones, green sub-pixel zones, and red sub-pixel zones; and coating a layer of transparent organic photoresist material on the substrate to form a transparent organic photoresist layer;

(2) subjecting the transparent organic photoresist layer to patterning through a photolithographic operation to remove portions of the transparent organic photoresist layer other than those corresponding to the blue sub-pixel zones in order to obtain a patterned transparent organic photoresist layer, where the patterned transparent organic photoresist layer serves as a blue sub-pixel part of the quantum dot color filter;

(3) subjecting an upper surface of the patterned transparent organic photoresist layer to hydrophobicity treatment;

(4) coating a layer of green quantum dot curable paste on the substrate, wherein the green quantum dot curable paste does not adhere to the patterned transparent organic photoresist layer and fills in grooves delimited by the patterned transparent organic photoresist layer and the substrate so as to form a green quantum dot curable paste layer after being cured, the green quantum dot curable paste layer corresponding to the green sub-pixel zones and the red sub-pixel zones;

(5) coating a layer of red quantum dot photoresist on the substrate, wherein the red quantum dot photoresist does not adhere to the patterned transparent organic photoresist layer and fills in grooves delimited by the patterned transparent organic photoresist layer and the green quantum dot curable paste layer so as to form a red quantum dot photoresist layer, the red quantum dot photoresist layer corresponding to the green sub-pixel zones and the red sub-pixel zones; and (6) subjecting the red quantum dot photoresist layer to patterning through a photolithographic operation in order to remove portions of the red quantum dot photoresist layer that correspond to the green sub-pixel zones and expose the portions of the green quantum dot curable paste layer located thereunder to thereby form a patterned red quantum dot photoresist layer, wherein the portions of the green quantum dot curable paste layer that correspond to the green sub-pixel zones serve as a green sub-pixel part of the quantum dot color filter and the portions of the green quantum dot curable paste layer that correspond to the red sub-pixel zones and the patterned red quantum dot photoresist layer located thereon serve as a red sub-pixel part of the quantum dot color filter.

Step 1 further comprises, before coating the layer of transparent organic photoresist material, forming a black matrix on the substrate through a photolithographic operation The black matrix separates the blue sub-pixel zones, the green sub-pixel zones, and the red sub-pixel zones from each other.

The method for manufacturing a quantum dot color filter further comprises Step 7: after Step 6, forming a green color resist layer on an exposed surface of the green quantum dot curable paste layer and forming a red color resist layer on a surface of the remaining red quantum dot photoresist layer.

The transparent organic photoresist layer formed in Step 1 has a thickness of 0-20 μm.

The substrate provided in Step 1 is used to make an array substrate of a liquid crystal display panel.

The substrate provided in Step 1 is used to make a color filter substrate of a liquid crystal display panel.

The quantum dot color filter is used in a display device having backlighting that is blue light.

The green quantum dot curable paste comprises a curable paste and green quantum dots mixed in the curable paste; the curable paste comprises a thermally curable paste or an ultraviolet (UV) curable paste; and in Step 4, curing is achieved with thermal curing or UV curing.

The patterned transparent organic photoresist layer, after the hydrophobicity treatment of the upper surface thereof, has a height that is greater than heights of the green quantum dot curable paste layer and the patterned red quantum dot photoresist layer; the transparent organic photoresist layer serves as photo spacers of a liquid crystal display panel.

The present invention also provide a method for manufacturing a quantum dot color filter, which comprises the following steps:

(1) providing a substrate, the substrate comprising a plurality of blue sub-pixel zones, green sub-pixel zones, and red sub-pixel zones; and coating a layer of transparent organic photoresist material on the substrate to form a transparent organic photoresist layer;

(2) subjecting the transparent organic photoresist layer to patterning through a photolithographic operation to remove portions of the transparent organic photoresist layer other than those corresponding to the blue sub-pixel zones in order to obtain a patterned transparent organic photoresist layer, where the patterned transparent organic photoresist layer serves as a blue sub-pixel part of the quantum dot color filter;

(3) subjecting an upper surface of the patterned transparent organic photoresist layer to hydrophobicity treatment;

(4) coating a layer of green quantum dot curable paste on the substrate, wherein the green quantum dot curable paste does not adhere to the patterned transparent organic photoresist layer and fills in grooves delimited by the patterned transparent organic photoresist layer and the substrate so as to form a green quantum dot curable paste layer after being cured, the green quantum dot curable paste layer corresponding to the green sub-pixel zones and the red sub-pixel zones;

(5) coating a layer of red quantum dot photoresist on the substrate, wherein the red quantum dot photoresist does not adhere to the patterned transparent organic photoresist layer and fills in grooves delimited by the patterned transparent organic photoresist layer and the green quantum dot curable paste layer so as to form a red quantum dot photoresist layer, the red quantum dot photoresist layer corresponding to the green sub-pixel zones and the red sub-pixel zones; and (6) subjecting the red quantum dot photoresist layer to patterning through a photolithographic operation in order to remove portions of the red quantum dot photoresist layer that correspond to the green sub-pixel zones and expose the portions of the green quantum dot curable paste layer located thereunder to thereby form a patterned red quantum dot photoresist layer, wherein the portions of the green quantum dot curable paste layer that correspond to the green sub-pixel zones serve as a green sub-pixel part of the quantum dot color filter and the portions of the green quantum dot curable paste layer that correspond to the red sub-pixel zones and the patterned red quantum dot photoresist layer located thereon serve as a red sub-pixel part of the quantum dot color filter;

wherein Step 1 further comprises, before coating the layer of transparent organic photoresist material, forming a black matrix on the substrate through a photolithographic operation;

wherein the black matrix separates the blue sub-pixel zones, the green sub-pixel zones, and the red sub-pixel zones from each other;

further comprising Step 7: after Step 6, forming a green color resist layer on an exposed surface of the green quantum dot curable paste layer and forming a red color resist layer on a surface of the remaining red quantum dot photoresist layer;

wherein the transparent organic photoresist layer formed in Step 1 has a thickness of 0-20 μm; and wherein the green quantum dot curable paste comprises a curable paste and green quantum dots mixed in the curable paste; the curable paste comprises a thermally curable paste or an ultraviolet (UV) curable paste; and in Step 4, curing is achieved with thermal curing or UV curing.

The efficacy of the present invention is that the present invention provides a method for manufacturing a quantum dot color filter. The method for manufacturing a quantum dot color filter of the present invention, after forming a blue sub-pixel part of a quantum dot color filter by applying a photolithographic operation to a transparent organic photoresist material, applies hydrophobicity treatment to the transparent organic photoresist layer so as to make use of hydrophobic characteristics so formed to help coat green quantum dot curable paste and red quantum dot photoresist sequentially on corresponding areas to form, in sequence, a green quantum dot curable paste layer and a red quantum dot photoresist layer located thereon, and then applies photolithographic operations to subject portions of the red quantum dot photoresist layer to etching for forming a green sub-pixel part and a red sub-pixel part of the quantum dot color filter, whereby compared to the conventional ways of manufacturing a quantum dot color filter, at least one round of photolithographic operation can be saved to greatly simplify the manufacturing process, reduce cost, and improve manufacturing efficiency, and it only needs to develop one type of quantum dot photoresist so as to greatly reduce difficulty and cost of development.

For better understanding of the features and technical contents of the present invention, reference will be made to the following detailed description of the present invention and the attached drawings. However, the drawings are provided for the purposes of reference and illustration and are not intended to impose limitations to the present invention.

BRIEF DESCRIPTION OF THE DRAWINGS

The technical solution, as well as other beneficial advantages, of the present invention will become apparent from the following detailed description of an embodiment of the present invention, with reference to the attached drawings.

In the drawings.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 1:
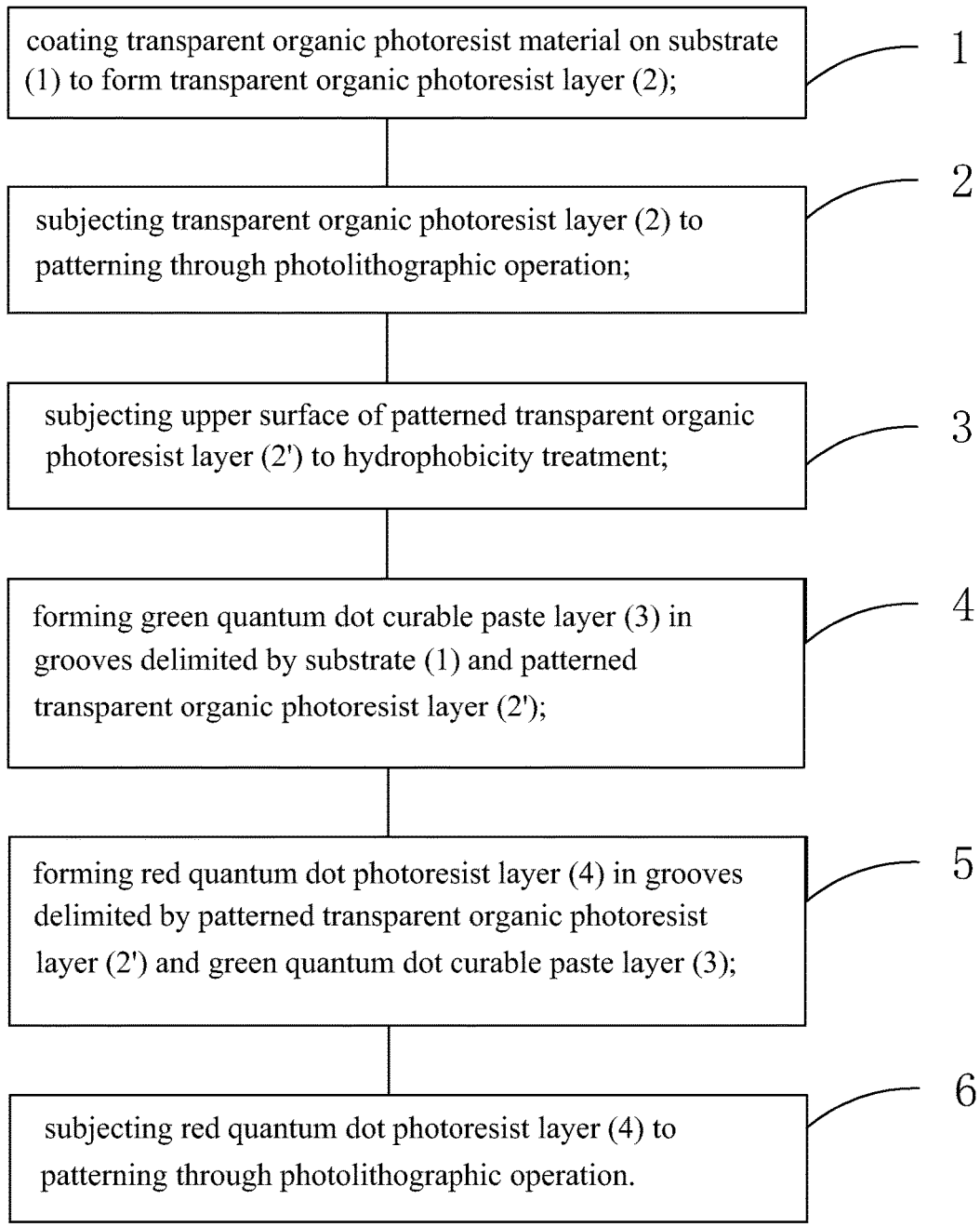
FIG. 1 is a flow chart illustrating a method for manufacturing a quantum dot color filter according to the present invention.
Figure 2:
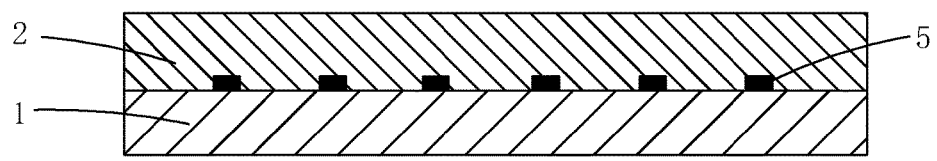
FIG. 2 is a schematic view illustrating step 1 of the method for manufacturing a quantum dot color filter according to the present invention.

Referring to FIGS. 1-8, the present invention provides a method for manufacturing a quantum dot color filter, which comprises the following steps:

Step 1: as shown in FIG. 2, providing a substrate 1, the substrate 1 comprising a plurality of blue sub-pixel zones, green sub-pixel zones, and red sub-pixel zones; and coating a layer of transparent organic photoresist material on the substrate 1 to form a transparent organic photoresist layer 2.

Specifically, Step 1 further comprises, before coating the layer of transparent organic photoresist material, forming a black matrix 5 on the substrate 1 through a photolithographic operation such that the black matrix 5 separates the blue sub-pixel zones, the green sub-pixel zones, and the red sub-pixel zones from each other.

Specifically, the transparent organic photoresist layer 2 formed in Step 1 has a thickness of 0-20 μm.

Figure 3:
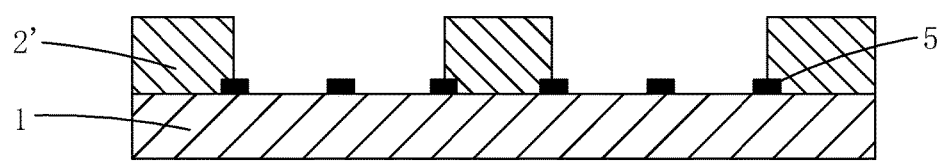
FIG. 3 is a schematic view illustrating step 2 of the method for manufacturing a quantum dot color filter according to the present invention.

Step 2: as shown in FIG. 3, subjecting the transparent organic photoresist layer 2 to patterning through a photolithographic operation to remove portions of the transparent organic photoresist layer 2 other than those corresponding to the blue sub-pixel zones in order to obtain a patterned transparent organic photoresist layer 2', where the patterned transparent organic photoresist layer 2' serves as a blue sub-pixel part of the quantum dot color filter.

Figure 4:
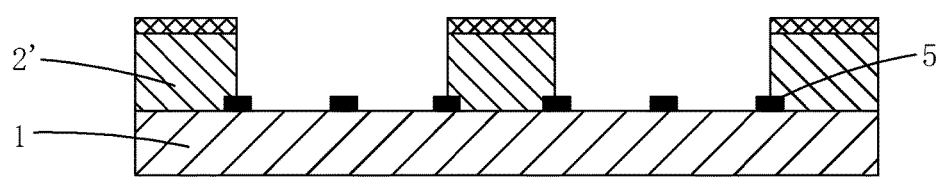
FIG. 4 is a schematic view illustrating step 3 of the method for manufacturing a quantum dot color filter according to the present invention.

Step 3: as shown in FIG. 4, subjecting upper surfaces of remaining portions of the transparent organic photoresist layer 2' to hydrophobicity treatment in order to reduce contact angles of green quantum dot curable paste and red quantum dot photoresist used in subsequent steps with respect thereto and reduce adhesion of the green quantum dot curable paste and the red quantum dot photoresist thereon.

Figure 5:
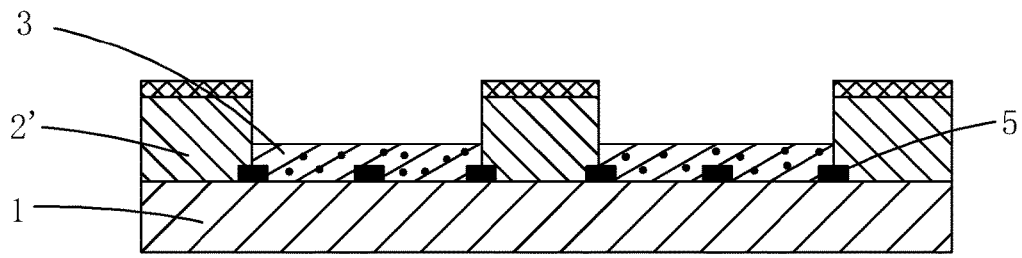
FIG. 5 is a schematic view illustrating step 4 of the method for manufacturing a quantum dot color filter according to the present invention.

Step 4: as shown in FIG. 5, coating a layer of green quantum dot curable paste on the substrate 1, where since the upper surfaces of the patterned transparent organic photoresist layer 2' have been subjected to hydrophobicity treatment, the green quantum dot curable paste does not adhere to the patterned transparent organic photoresist layer 2' and automatically flows into and fills in grooves delimited by the patterned transparent organic photoresist layer 2' and the substrate 1 so that after curing, a green quantum dot curable paste layer 3 is obtained where the green quantum dot curable paste layer 3 corresponds to the green sub-pixel zones and the red sub-pixel zones.

Specifically, the green quantum dot curable paste comprises a curable paste and green quantum dots mixed in the curable paste. The curable paste can be a thermally curable paste or an ultraviolet (UV) curable paste. In Step 4, curving is achieved with thermal curing or UV curving.

Figure 6:
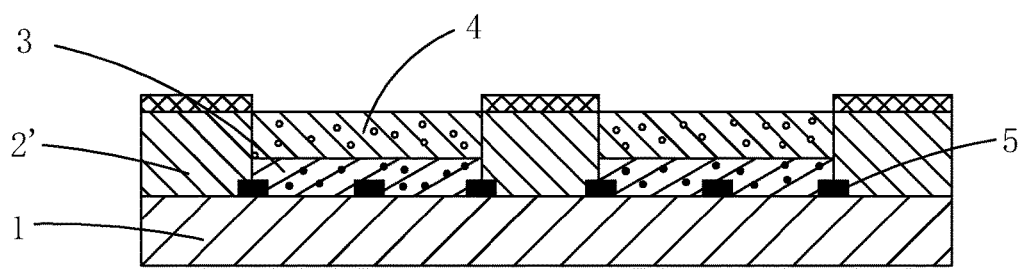
FIG. 6 is a schematic view illustrating step 5 of the method for manufacturing a quantum dot color filter according to the present invention.

Step 5: as shown in FIG. 6, coating a layer of red quantum dot photoresist on the substrate 1, where since the upper surfaces of the patterned transparent organic photoresist layer 2' have been subjected to hydrophobicity treatment, the red quantum dot photoresist does not adhere to the patterned transparent organic photoresist layer 2' and automatically flows into and fills in the grooves delimited by the patterned transparent organic photoresist layer 2' and the green quantum dot curable paste layer 3 so as to form a red quantum dot photoresist layer 4, where the red quantum dot photoresist layer 4 corresponds to the green sub-pixel zones and the red sub-pixel zones.

Figure 7:
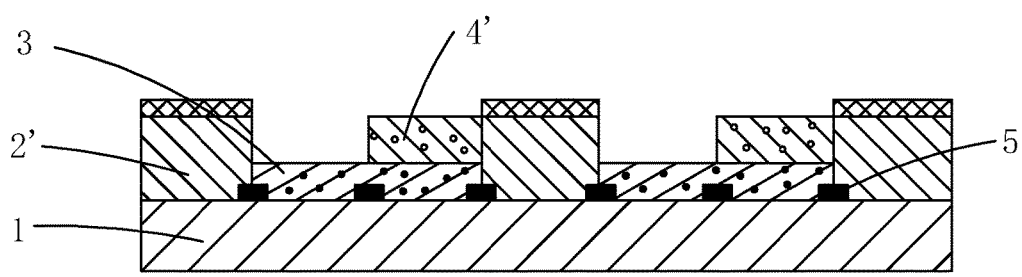
FIG. 7 is a schematic view illustrating step 6 of the method for manufacturing a quantum dot color filter according to the present invention.

Step 6: as shown in FIG. 7, subjecting the red quantum dot photoresist layer 4 to patterning through a photolithographic operation in order to remove portions of the red quantum dot photoresist layer 4 that correspond to the green sub-pixel zones and expose the portions of the green quantum dot curable paste layer 3 located thereunder to thereby form a patterned red quantum dot photoresist layer 4', wherein the portions of the green quantum dot curable paste layer 3 that correspond to the green sub-pixel zones serve as a green sub-pixel part of the quantum dot color filter and the portions of the green quantum dot curable paste layer 3 that correspond to the red sub-pixel zones and the patterned red quantum dot photoresist layer 4' located thereon serve as a red sub-pixel part of the quantum dot color filter.

Specifically, in Step 1, the organic photoresist layer 2 can be formed to be relatively high so that the upper surface of the patterned transparent organic photoresist layer 2', after the hydrophobicity treatment, may have a height that is greater than the heights of the green quantum dot curable paste layer 3 and the patterned red quantum dot photoresist layer 4' so that the patterned transparent organic photoresist layer 2' may also function as photo spacers inside a liquid crystal display panel.

Specifically, the quantum dot color filter manufactured according to the present invention is applicable to a display device having backlighting that is blue light. The blue backlighting transmits upwards, from the underside of the substrate 1, through the substrate 1, wherein in the blue sub-pixel zones, the blue light emitting from the blue-light backlight module may directly pass through the patterned transparent organic photoresist layer 2' to emit as blue light; in the green sub-pixel zones, the green quantum dot curable paste layer 3 is excited by the blue backlighting to emit green light; in the red sub-pixel zones, the patterned red quantum dot photoresist layer 4' located on the green quantum dot curable paste layer 3 is excited by the green light to emit red light so as to achieve the function of color filtering.

Figure 8:
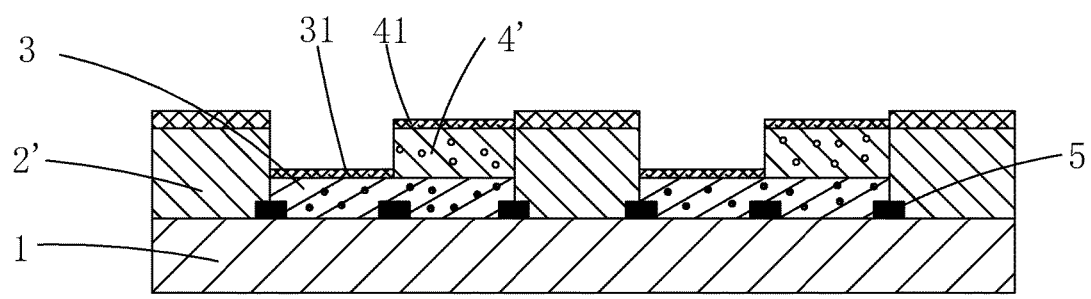
FIG. 8 is a schematic view illustrating step 7 of the method for manufacturing a quantum dot color filter according to the present invention.

In addition, as shown in FIG. 8, the method for manufacturing a quantum dot color filter further comprises Step 7: after Step 6, forming a green color resist layer 31 on an exposed surface of the green quantum dot curable paste layer 3 to filter out non-excited blue light of the backlighting and forming a red color resist layer 41 on a surface of the remaining red quantum dot photoresist layer 4' to filter out non-excited blue and green light.

The quantum dot color filter of the present invention can be used as a color filter for the conventional liquid crystal display (LCD) and positioned at one side of the color filter substrate of a display panel, or alternatively the quantum dot color filter can be formed on one side of an array substrate of a display panel, this being a COA (Color filter On Array) design. These all provide a quantum dot display panel with the quantum dot color filter.

In summary, the present invention provides a method for manufacturing a quantum dot color filter, which, after forming a blue sub-pixel part of a quantum dot color filter by applying a photolithographic operation to a transparent organic photoresist material, applies hydrophobicity treatment to the transparent organic photoresist layer so as to make use of hydrophobic characteristics so formed to help coat green quantum dot curable paste and red quantum dot photoresist sequentially on corresponding areas to form, in sequence, a green quantum dot curable paste layer and a red quantum dot photoresist layer located thereon, and then applies photolithographic operations to subject portions of the red quantum dot photoresist layer to etching for forming a green sub-pixel part and a red sub-pixel part of the quantum dot color filter, whereby compared to the conventional ways of manufacturing a quantum dot color filter, at least one round of photolithographic operation can be saved to greatly simplify the manufacturing process, reduce cost, and improve manufacturing efficiency, and it only needs to develop one type of quantum dot photoresist so as to greatly reduce difficulty and cost of development.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A method for manufacturing a quantum dot color filter, comprising the following steps:
   (1) providing a substrate, the substrate comprising a plurality of blue sub-pixel zones, green sub-pixel zones, and red sub-pixel zones; and coating a layer of transparent organic photoresist material on the substrate to form a transparent organic photoresist layer;
   (2) subjecting the transparent organic photoresist layer to patterning through a photolithographic operation to remove portions of the transparent organic photoresist layer other than those corresponding to the blue sub-pixel zones in order to obtain a patterned transparent organic photoresist layer, where the patterned transparent organic photoresist layer serves as a blue sub-pixel part of the quantum dot color filter;
   (3) subjecting an upper surface of the patterned transparent organic photoresist layer to hydrophobicity treatment;
   (4) coating a layer of green quantum dot curable paste on the substrate, wherein the green quantum dot curable paste does not adhere to the patterned transparent organic photoresist layer and fills in grooves delimited by the patterned transparent organic photoresist layer and the substrate so as to form a green quantum dot curable paste layer after being cured, the green quantum dot curable paste layer corresponding to the green sub-pixel zones and the red sub-pixel zones;
   (5) coating a layer of red quantum dot photoresist on the substrate, wherein the red quantum dot photoresist does not adhere to the patterned transparent organic photoresist layer and fills in grooves delimited by the patterned transparent organic photoresist layer and the green quantum dot curable paste layer so as to form a red quantum dot photoresist layer, the red quantum dot photoresist layer corresponding to the green sub-pixel zones and the red sub-pixel zones; and
   (6) subjecting the red quantum dot photoresist layer to patterning through a photolithographic operation in order to remove portions of the red quantum dot photoresist layer that correspond to the green sub-pixel zones and expose the portions of the green quantum dot curable paste layer located thereunder to thereby form a patterned red quantum dot photoresist layer, wherein the portions of the green quantum dot curable paste layer that correspond to the green sub-pixel zones serve as a green sub-pixel part of the quantum dot color filter and the portions of the green quantum dot curable paste layer that correspond to the red sub-pixel zones and the patterned red quantum dot photoresist layer located thereon serve as a red sub-pixel part of the quantum dot color filter.

2. The method for manufacturing a quantum dot color filter as claimed in claim 1, wherein Step 1 further comprises, before coating the layer of transparent organic photoresist material, forming a black matrix on the substrate through a photolithographic operation.

3. The method for manufacturing a quantum dot color filter as claimed in claim 2, wherein the black matrix separates the blue sub-pixel zones, the green sub-pixel zones, and the red sub-pixel zones from each other.

4. The method for manufacturing a quantum dot color filter as claimed in claim 1 further comprising Step 7: after Step 6, forming a green color resist layer on an exposed surface of the green quantum dot curable paste layer and forming a red color resist layer on a surface of the remaining red quantum dot photoresist layer.

5. The method for manufacturing a quantum dot color filter as claimed in claim 1, wherein the transparent organic photoresist layer formed in Step 1 has a thickness of 0-20 μm.

6. The method for manufacturing a quantum dot color filter as claimed in claim 1, wherein the substrate provided in Step 1 is used to make an array substrate of a liquid crystal display panel.

7. The method for manufacturing a quantum dot color filter as claimed in claim 1, wherein the substrate provided in Step 1 is used to make a color filter substrate of a liquid crystal display panel.

8. The method for manufacturing a quantum dot color filter as claimed in claim 1, wherein the quantum dot color filter is used in a display device having backlighting that is blue light.

9. The method for manufacturing a quantum dot color filter as claimed in claim 1, wherein the green quantum dot curable paste comprises a curable paste and green quantum dots mixed in the curable paste; the curable paste comprises a thermally curable paste or an ultraviolet (UV) curable paste; and in Step 4, curing is achieved with thermal curing or UV curing.

10. The method for manufacturing a quantum dot color filter as claimed in claim 1, wherein the patterned transparent organic photoresist layer, after the hydrophobicity treatment of the upper surface thereof, has a height that is greater than heights of the green quantum dot curable paste layer and the patterned red quantum dot photoresist layer; the transparent organic photoresist layer serves as photo spacers of a liquid crystal display panel.

11. A method for manufacturing a quantum dot color filter, comprising the following steps:
  (1) providing a substrate, the substrate comprising a plurality of blue sub-pixel zones, green sub-pixel zones, and red sub-pixel zones; and coating a layer of transparent organic photoresist material on the substrate to form a transparent organic photoresist layer;
  (2) subjecting the transparent organic photoresist layer to patterning through a photolithographic operation to remove portions of the transparent organic photoresist layer other than those corresponding to the blue sub-pixel zones in order to obtain a patterned transparent organic photoresist layer, where the patterned transparent organic photoresist layer serves as a blue sub-pixel part of the quantum dot color filter;
  (3) subjecting an upper surface of the patterned transparent organic photoresist layer to hydrophobicity treatment;
  (4) coating a layer of green quantum dot curable paste on the substrate, wherein the green quantum dot curable paste does not adhere to the patterned transparent organic photoresist layer and fills in grooves delimited by the patterned transparent organic photoresist layer and the substrate so as to form a green quantum dot curable paste layer after being cured, the green quantum dot curable paste layer corresponding to the green sub-pixel zones and the red sub-pixel zones;
  (5) coating a layer of red quantum dot photoresist on the substrate, wherein the red quantum dot photoresist does not adhere to the patterned transparent organic photoresist layer and fills in grooves delimited by the patterned transparent organic photoresist layer and the green quantum dot curable paste layer so as to form a red quantum dot photoresist layer, the red quantum dot photoresist layer corresponding to the green sub-pixel zones and the red sub-pixel zones; and
  (6) subjecting the red quantum dot photoresist layer to patterning through a photolithographic operation in order to remove portions of the red quantum dot photoresist layer that correspond to the green sub-pixel zones and expose the portions of the green quantum dot curable paste layer located thereunder to thereby form a patterned red quantum dot photoresist layer, wherein the portions of the green quantum dot curable paste layer that correspond to the green sub-pixel zones serve as a green sub-pixel part of the quantum dot color filter and the portions of the green quantum dot curable paste layer that correspond to the red sub-pixel zones and the patterned red quantum dot photoresist layer located thereon serve as a red sub-pixel part of the quantum dot color filter;
wherein Step 1 further comprises, before coating the layer of transparent organic photoresist material, forming a black matrix on the substrate through a photolithographic operation;
wherein the black matrix separates the blue sub-pixel zones, the green sub-pixel zones, and the red sub-pixel zones from each other;
further comprising Step 7: after Step 6, forming a green color resist layer on an exposed surface of the green quantum dot curable paste layer and forming a red color resist layer on a surface of the remaining red quantum dot photoresist layer;
wherein the transparent organic photoresist layer formed in Step 1 has a thickness of 0-20 µm; and
wherein the green quantum dot curable paste comprises a curable paste and green quantum dots mixed in the curable paste; the curable paste comprises a thermally curable paste or an ultraviolet (UV) curable paste; and in Step 4, curing is achieved with thermal curing or UV curing.

12. The method for manufacturing a quantum dot color filter as claimed in claim 11, wherein the substrate provided in Step 1 is used to make an array substrate of a liquid crystal display panel.

13. The method for manufacturing a quantum dot color filter as claimed in claim 11, wherein the substrate provided in Step 1 is used to make a color filter substrate of a liquid crystal display panel.

14. The method for manufacturing a quantum dot color filter as claimed in claim 11, wherein the quantum dot color filter is used in a display device having backlighting that is blue light.

15. The method for manufacturing a quantum dot color filter as claimed in claim 11, wherein the patterned transparent organic photoresist layer, after the hydrophobicity treatment of the upper surface thereof, has a height that is greater than heights of the green quantum dot curable paste layer and the patterned red quantum dot photoresist layer; the transparent organic photoresist layer serves as photo spacers of a liquid crystal display panel.

* * * * *